(12) United States Patent
Hayden

(10) Patent No.: US 7,548,133 B2
(45) Date of Patent: *Jun. 16, 2009

(54) MODULATION OF AN RF TRANSMIT SIGNAL

(75) Inventor: Douglas Todd Hayden, Boise, ID (US)

(73) Assignee: Preco Electronics, Inc., Boise, ID (US)

( * ) Notice: Subject to any disclaimer, the term of this patent is extended or adjusted under 35 U.S.C. 154(b) by 272 days.

This patent is subject to a terminal disclaimer.

(21) Appl. No.: 11/278,936

(22) Filed: Apr. 6, 2006

(65) Prior Publication Data

US 2007/0252657 A1     Nov. 1, 2007

(51) Int. Cl.
*H03C 3/00* (2006.01)
(52) U.S. Cl. .................. 332/120; 375/297; 455/102; 455/108
(58) Field of Classification Search .................. 332/117, 332/120; 375/297; 455/102, 108
See application file for complete search history.

(56) References Cited

U.S. PATENT DOCUMENTS 3,731,201 A    5/1973   Frisbie
4,635,296 A    1/1987   Dinsmore
4,896,372 A    1/1990   Weaver
5,917,346 A    6/1999   Gord
6,404,357 B1   6/2002   Taunton
7,123,664 B2 * 10/2006  Matero .................. 375/295
2004/0213351 A1 10/2004 Shattil
2007/0014382 A1 * 1/2007 Shakeshaft et al. .......... 375/297

* cited by examiner

*Primary Examiner*—Robert Pascal
*Assistant Examiner*—James E Goodley
(74) *Attorney, Agent, or Firm*—Townsend and Townsend and Crew LLP; Kenneth R. Allen

(57) ABSTRACT

To modulate the frequency of a signal to be transmitted, the biasing voltage applied to a terminal of a transistor is dynamically modulated. To achieve this, the pulse width or a pulse amplitude of a control signal is modulated. Alternatively, a multi-bit control signal may be used to perform the modulation. The frequency of the transmitted signal is optionally modulated by varying the temperature of a oscillator. To vary this temperature, the current flowing through one or more resistive elements positioned in proximity of the oscillator is varied in response to the pulse width or amplitude of a second control signal. The temperature may also be changed by varying a multi-bit control signal. As the level of this current flow varies, the amount of heat emitted by the resistors vary, thereby changing the temperature of the oscillator which has a non-zero temperature coefficient.

32 Claims, 6 Drawing Sheets

MODULATION OF AN RF TRANSMIT SIGNAL

BACKGROUND OF THE INVENTION

The present invention relates to electronic circuits, and more particularly, to modulating the frequency of an RF signal being transmitted In high-frequency electronic circuits, there is often a need to change the frequency of the transmit signal, i.e., to shift from one frequency to another, in order to prevent interference to and from other RF transceiver units. Such frequency shifting may be achieved by varying the bias to a varactor diode, that in turn, changes the capacitance values disposed in a crystal oscillator circuit.

In other conventional systems, to change the oscillation frequency, a potentiometer is used to vary the resistance of an RC network coupled to the drain terminal of an RF transistor thereby to vary the drain bias voltage. Therefore, the oscillation frequency of the transmit signal can only be varied manually. A need continues to exist for a circuit operative to dynamically vary the oscillation frequency of an RF transmit signal.

BRIEF SUMMARY OF THE INVENTION

In accordance with one embodiment of the present invention, the frequency of a signal to be transmitted is modulated by varying the duty cycle of a pulse-width modulated control signal. The duty cycle of the pulse-width modulated signal is varied by changing a register value disposed in a control block and is used to vary the biasing voltage applied to a current carrying terminal of a transistor. The oscillation frequency of the transmitted signal is modulated as this biasing voltage varies. In accordance with another embodiment of the present invention, the signal frequency is modulated by other techniques, such as modulating the amplitude of the control signal, varying the binary value of a multi-bit control signal, or the like.

In accordance with another embodiment of the present invention, the frequency of a signal to be transmitted is modulated by varying the temperature of an oscillator element. To vary this temperature, the amount of current flowing through a number of resistive elements positioned in proximity of the oscillator is caused to vary in response to the duty cycle of a second pulse-width modulated signal. As the level of this current flow changes, the amount of heat generated by the resistors vary, thereby changing the temperature of the oscillator. Since the oscillator has a non-zero temperature coefficient, its frequency of oscillation varies as the heat applied thereto is caused to vary. In accordance with another embodiment of the present invention, the amount of current flowing through the resistive elements positioned in proximity of the oscillator is caused to vary in response to amplitude modulation of a signal, by changing the binary value of a multi-bit control signal, or the like.

DETAILED DESCRIPTION OF THE INVENTION

Figure 1:
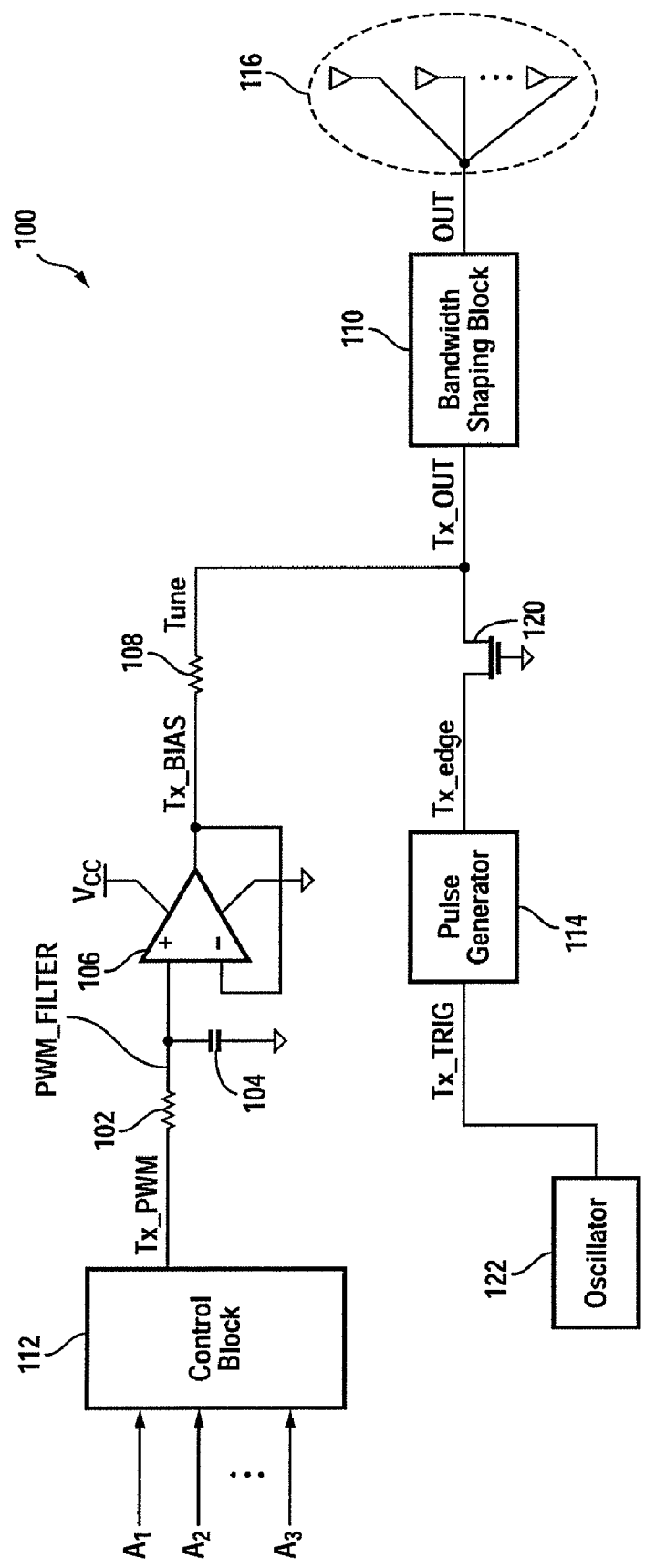
FIG. 1 is a schematic diagram of a circuit configured to modulate the frequency of a transmit signal, in accordance with one embodiment of the present invention.

FIG. 1 is a schematic diagram of a radio frequency (RF) transmitter circuit 100 configured to generate and vary the frequency of signal OUT transmitted by one or more transmit antennas 116, in accordance with one embodiment of the present invention. Circuit 100 is shown as including a control block 112, a resistor 102, a capacitor 104, an amplifier 106, a resistor 108, a bandwidth shaping circuit 110, a pulse generator 114, an oscillator 122 and an RF transistor 120. Circuit 100 is adapted to generate an RF signal OUT having a frequency that may be dynamically varied, in part, using the control signals $A_1, A_2 \ldots$ and $A_n$, applied to control block 112 in accordance with one embodiment of the present invention.

Control block 112 includes a pulse width modulator (not shown) adapted to generate a pulse-width modulated (PWM) signal TX_PWM that is a control signal and is applied to the first terminal of resistor 102. In one embodiment, control block 112 further includes a register that can be accessed for read/write operations and whose value is used to vary the duty cycle of signal TX_PWM generated by the pulse-width modulator. The register value may be initially set during production so as to ensure that the frequency of signal OUT is within the required limits. In one embodiment, this register value may be stored in a non-volatile memory, such as an electrically erasable programmable read only memory (EEPROM) also disposed in control block 112. In accordance with the present invention, when changes in the frequency of the transmit signal OUT are required to inhibit, for example, interference to or from other RF signals, the register value is varied to cause the duty cycle of signal TX_PWM to change. Thus, in accordance with the present invention, by varying the frequency of signal OUT using the duty cycle of signal TX_PWM via the register disposed in control block 112, interference to or from other sources of RF is inhibited.

Figure 2:
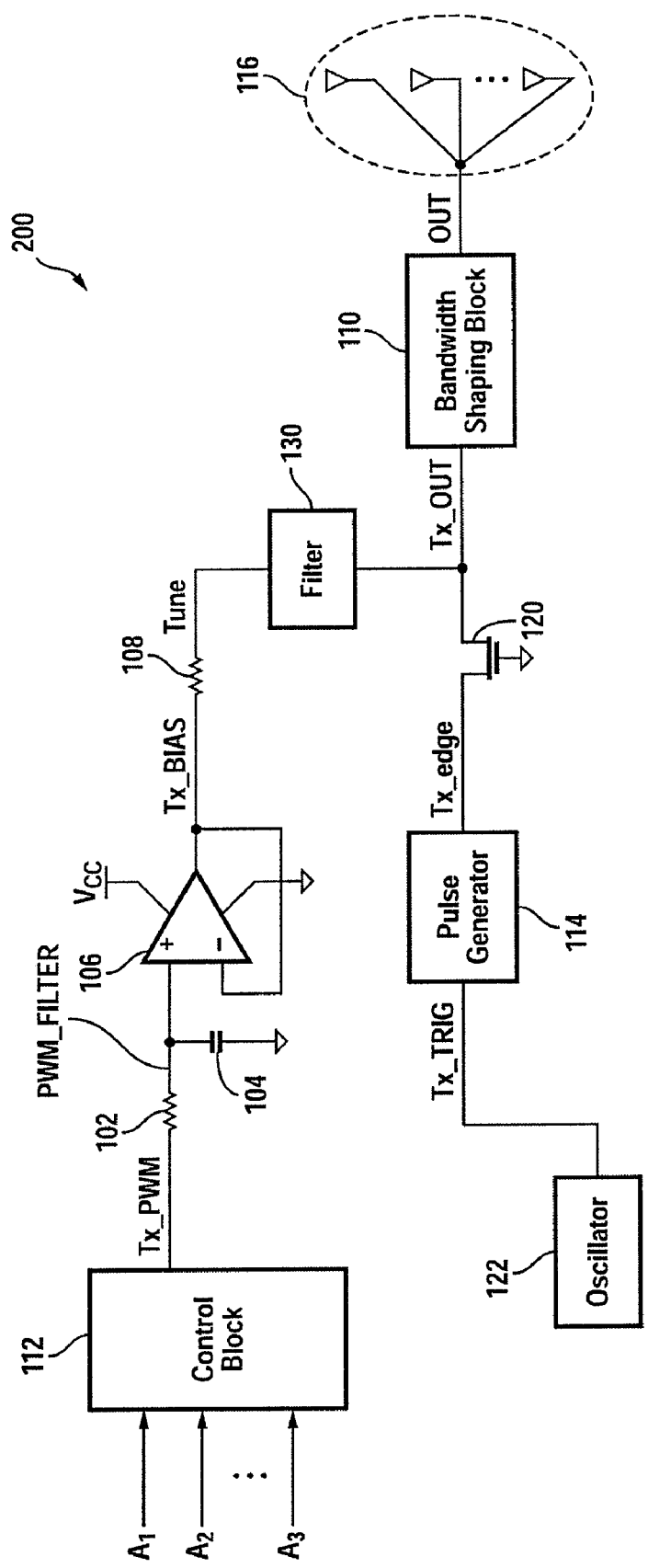
FIG. 2 is a schematic diagram of a circuit configured to modulate the frequency of a transmit signal, in accordance with another embodiment of the present invention.

Resistor 102 and capacitor 104 form a low pass filter that filters out the high frequency components of signals from TX_PWM and delivers the filtered out signal PWM_Filter to the positive input terminal of operational amplifier 106. Operational amplifier 106 is configured as a voltage follower having an output terminal that is coupled to its negative input terminal, and a positive input terminal that receives signal PWM_Filter. Signal TX_Bias generated by op amp 106 has a higher current drive capability than signal PWM_Filter and is applied to a first terminal of resistor 108. The other terminal of resistor 108 generates signal Tune that is applied to the drain terminal of RF transistor 120. In some embodiments, such as that shown in FIG. 2, a filtering block 130, which may be an RC filter, is used to filter out the high frequency components of signal Tune and apply the filtered signal to the drain terminal of transistor 120.

Bandwidth shaping block 110 is adapted to shape the bandwidth of signal TX_Out generated at the drain terminal of transistor 120 so as to satisfy the transmit spectrum requirements established by the FCC or other regulating body. In one exemplary embodiment, transistor 120 operates at a repetition rate of 2 MHz, and signal Tune has a frequency that is several orders of magnitude smaller than 2 MHz. In one embodiment, signal Tune varies between 3.25 volts to 4.75 volts when a supply of 5 volts is used.

Oscillator 112 is adapted to generate a signal TX_TRIG applied to an input terminal of pulse generator 114. Pulse generator 114 generates a pulse signal TX_edge upon detecting a transition on signal TX_Trig generated by oscillator 120. In one embodiment, signal TX_Trig is a square-wave signal. Pulse signal TX_edge generated by pulse generator 114 is applied to the source terminal of transistor 120.

Figure 3:
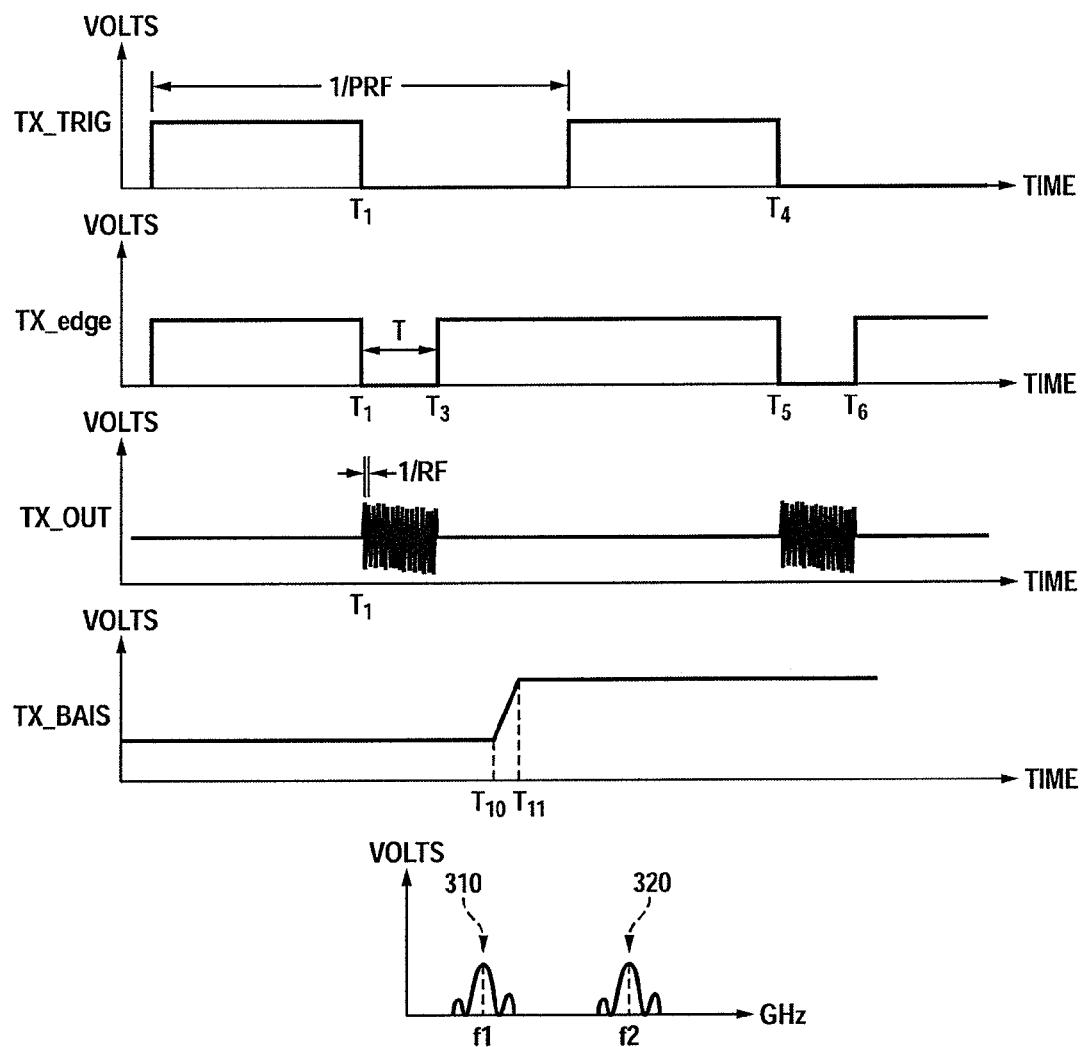
FIG. 3 is a timing diagram of a number of signals generated by the circuit shown in FIG. 1, in accordance with one exemplary embodiment of the present invention.

FIG. 3 is a timing diagram of various signals generated by transmitter circuit 100, in accordance with some embodiments. Signal TX_Trig is shown as having a period of 1/PRF, where PRF refers to the Pulse Repetition Frequency. At time T1, signal TX_Trig is shown as making a high-to-low transition. Accordingly, pulse generator 114 generates a pulse signal TX_edge having a duration defined by times T2 and T3. At time T4, signal TX_Trig is shown as making a second high-to-low transition. Accordingly, pulse generator 114 generates a second pulse TX_edge having a duration defined by times T5 and T6. Signal TX_edge has relatively fast rise and fall times.

The length of the conductive line that couples the gate terminal of transistor 120 to the ground terminal is so selected so as to achieve a certain capacitive, inductive, and conductive values. In other words, the length of this conductive gate is a factor affecting the oscillation frequency of transistor 120, in accordance with well known transmission line effects. When the high-to-low pulse transitions on signal TX_edge are received by transistor 120, the drain terminal of transistor 120 starts to oscillate at a frequency defining the frequency of transmit signal OUT, based on the bias points of transistor 120 and the spectral energy contained in signal TX_Trig, as shown by signal TX_OUT. The oscillation is transient and dissipates after a time period. When signal TX_edge returns to its previous value at, e.g., times T3, T6, the oscillation at the drain terminal of transistor 120 is terminated, as shown in FIG. 3. A pulse is caused to appear on signal TX_edge at a rate that can vary, in some embodiments, from several microseconds to sub-nanoseconds. In one embodiment, control block 112 is a standard off-the-shelf microcontroller, such as model number DSCPIC30F4012, available from Microchip Technology located in Chandler Ariz. USA.

Also shown in FIG. 3 is a timing diagram of signal TX_Bias. Prior to time T10, signal TX_Bias is assumed to have been generated using a duty cycle of 20%, and after time T11 signal TX_Bias is assumed to have been generated using a duty cycle of 60%. Accordingly signal TX_Bias has a DC level that is smaller prior to time T10 than it is after time T11. The frequency spectrum of the transmit signal OUT is also shown in FIG. 3. When signal TX_bias has a duty cycle of 20%, output signal OUT has a frequency spectrum identified with reference numeral 310. When signal TX_bias has a duty cycle of 60%, output signal OUT has a frequency spectrum identified with reference numeral 320. As is seen from FIG. 3, by changing the duty cycle of signal TX_PWM and thereby changing the bias level of signal TX_Bias, the frequency of signal OUT is varied dynamically, in accordance with the present invention.

Figure 4:
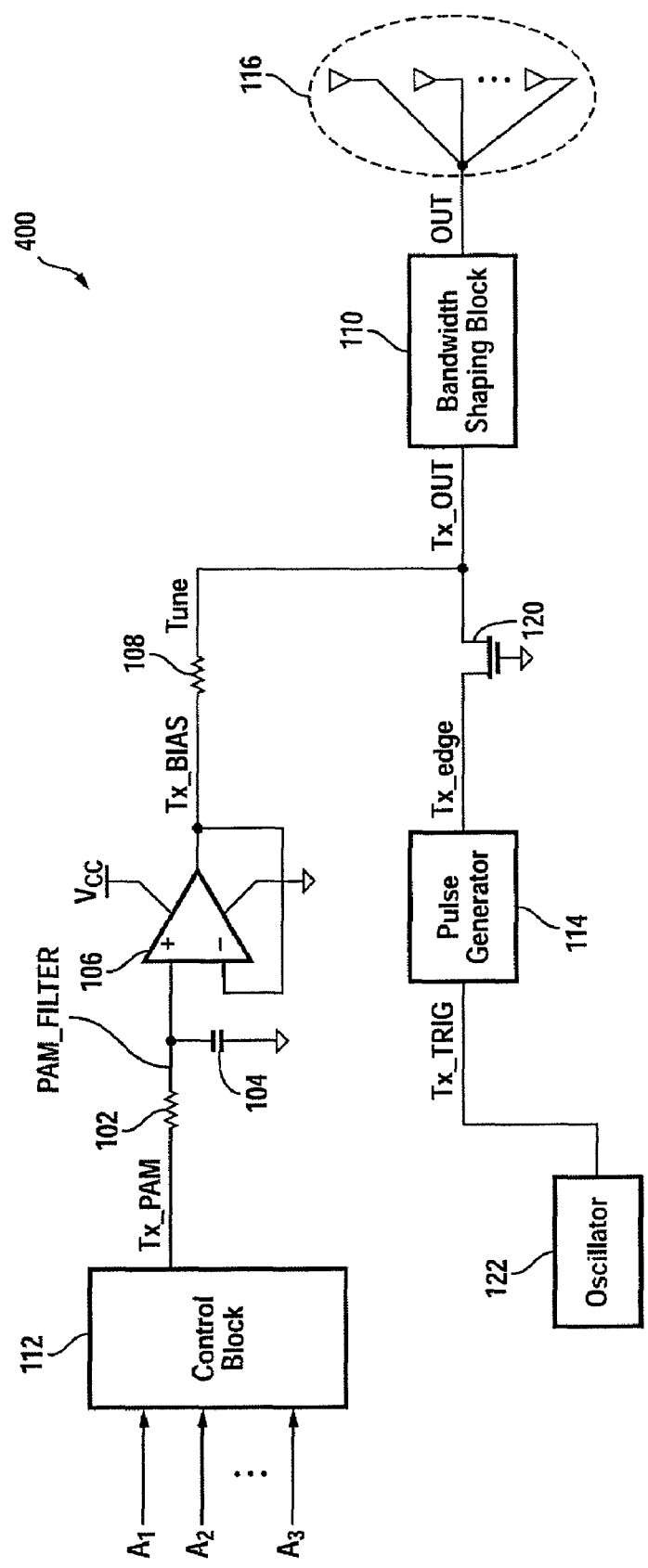
FIG. 4 is a schematic diagram of a circuit configured to modulate the frequency of a transmit signal, in accordance with another embodiment of the present invention.

FIG. 4 is a schematic block diagram of a radio frequency (RF) transmitter circuit 400 configured to generate and vary the frequency of signal OUT transmitted by one or more transmit antennas 116, in accordance with another embodiment of the present invention. In transmitter circuit 400, control block 112 is configured to generate signal TX_PAM, whose amplitude is modulated using control signals A1, A2 . . . A3. In other words, signal TX_PAM is a pulse-amplitude modulated signal. The remaining blocks shown in FIG. 4 operate in the same manner shown and described above with respect to FIG. 1. By modulating the amplitude of signal TX_PAM, via varying, for example, one ore more register values disposed in control block 112, the voltage applied to the drain terminal of transistor 120 via signal Tune is changed to thereby vary the frequency of signal OUT.

Figure 5:
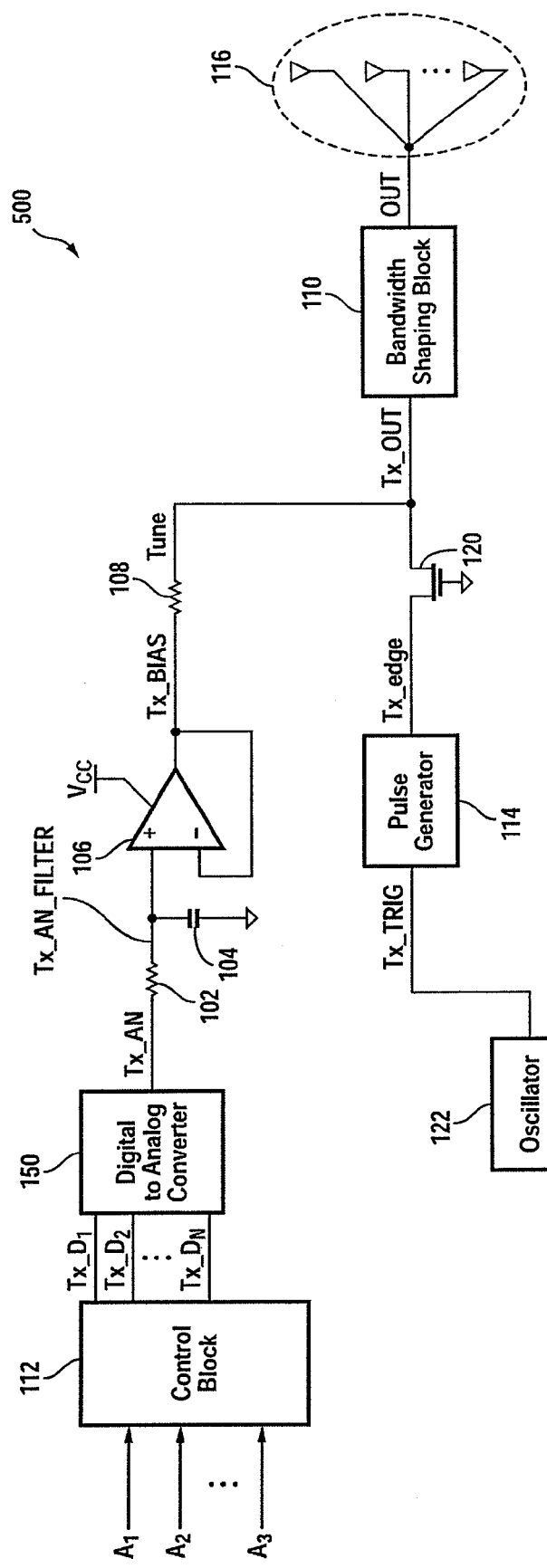
FIG. 5 is a schematic diagram of a circuit configured to modulate the frequency of a transmit signal, in accordance with another embodiment of the present invention.

FIG. 5 is a schematic block diagram of a radio frequency (RF) transmitter circuit 500 configured to generate and vary the frequency of signal OUT transmitted by one or more transmit antennas 116, in accordance with another embodiment of the present invention. In transmitter circuit 500, control block 112 is configured to generate a multi-bit digital signal TX_D having N bits, namely signals $TX\_D_1$ $TX\_D_2$ . . . $TX\_D_N$ that are applied to digital-to-analog converter 150. Signal TX_D may be varied by changing the control signals A1, A2 . . . A3 applied to the input terminals of control block 112. As shown in FIG. 5, the N bits of signal D are applied to a digital-to-analog converter 150 that converts the received digital signal D to a corresponding analog signal TX_AN. Signal TX_AN is applied to resistor 102. The remaining blocks shown in FIG. 4 operate in the same manner shown and described above with respect to FIG. 1. By changing one or more bits of signal TX_D, the voltage applied to the drain terminal of transistor 120 via signal Tune is changed to thereby vary the frequency of signal OUT.

Figure 6:
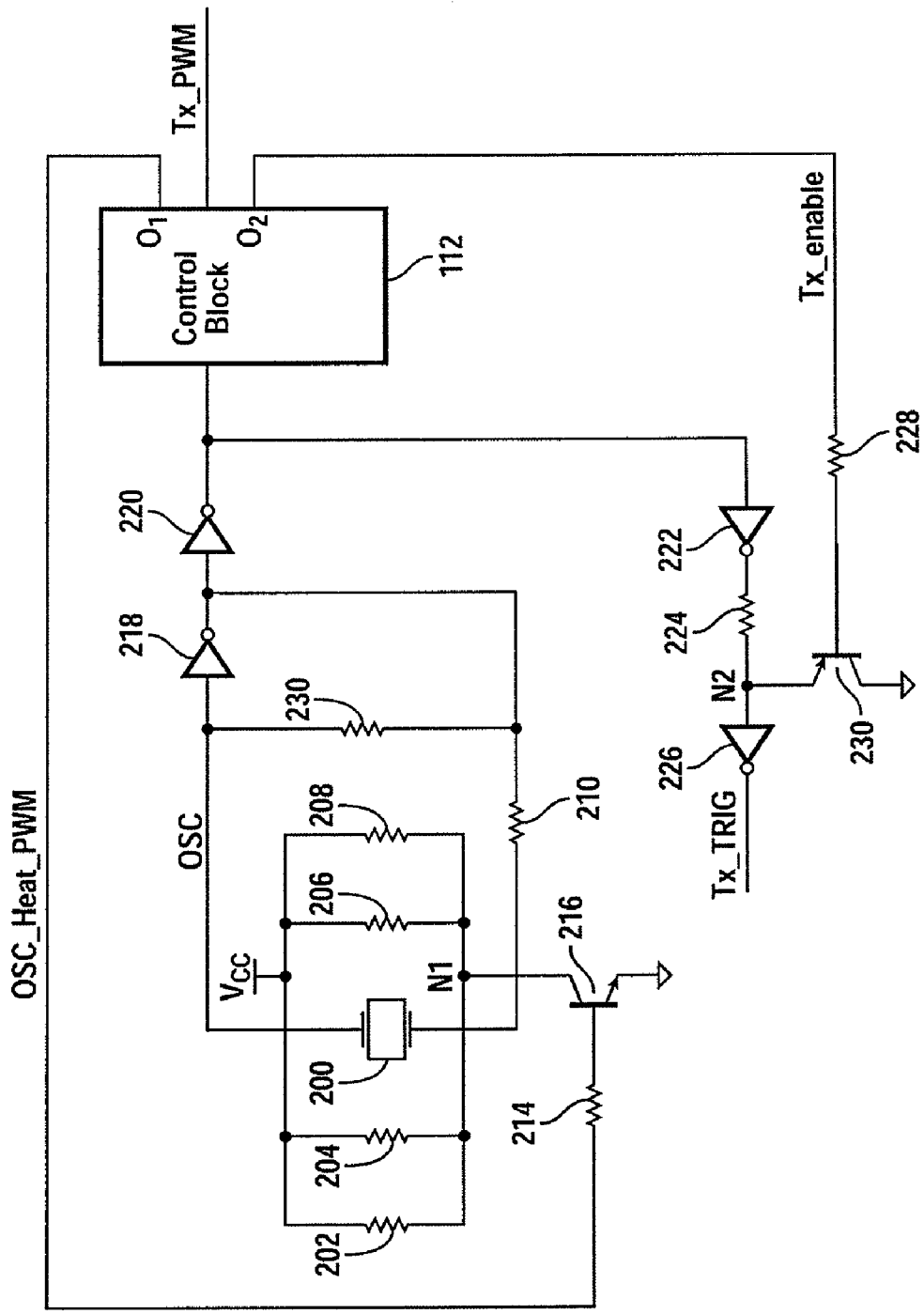
FIG. 6 is a schematic diagram of a circuit configured to modulate the frequency of a transmit signal, in accordance with another embodiment of the present invention.

In accordance with another embodiment of the present invention, the frequency of signal OUT is varied by varying the frequency of signal TX_Trig (FIG. 1) using one or more heating elements placed in proximity of an oscillator that generates the clock signal used to generate signal TX_Trig. Referring to FIG. 6, a pair of resistors 202, 204 are shown as positioned adjacent and to the left of oscillator 200, and a pair of resistors 206, 208 are shown as positioned adjacent and to the right of oscillator 200. While, in FIG. 4, four resistors are showing as being placed in proximity of oscillator 200, in other embodiments, more or fewer than four resistors may be used in any physical configuration that allows heat transfer to the oscillator. The following description is provided with reference to a control signal that is pulse-width modulated. It is understood, however, that the present invention is applicable to any other control signal with characteristics that may be varied using any other known techniques, such as digital-to-analog conversion, pulse amplitude modulation, and the like.

One terminal of each of resistors 202, 204, 206, and 208 is coupled to the supply power Vcc. The other terminal of these resistors is coupled to the collector terminal of transistor 216 via node N1. Control block 112, also shown in FIG. 1, generates signal OSC_Heat_PWM whose duty cycle may varied by changing the value of a register (not shown) disposed in control block 112.

Resistors 202, 204, 208, and 210 are used as heating elements heating oscillator 200 in order to vary its frequency. The base terminal of resistor 216 receives signal OSC_Heat_PWM whose duty cycle can be varied 0%, i.e., fully off, to 100%, i.e., fully on. By varying the duty cycle of signal OSC_Heat_PWM, the average on-time of transistor 216 is varied thus changing the average current that flows through resistors 202, 204, 206 and 208. In other words, by varying the duty cycle of signal OSC_Heat_PWM, the current through these four resistors and thus the amount of heat generated by these resistors may be modified. It is understood that oscillator 200 has a non-zero temperature coefficient and its oscillation frequency varies as a function of the temperature.

Signal OSC is generated by oscillator 20 in combination with a pair of inverters 218 and 230. The output of inverter 218 is applied to a terminal of oscillator 200 via resistor 210. The signal generated by inverter 220 is applied to an input terminal of inverter 222 whose output signal is applied to one of the terminals of resistor 224. The other terminal of resistor 224 is coupled to node N2 and to an input terminal of inverter 226. Signal TX_Trig, which is also shown in FIG. 1, is generated by inverter 226. Inverters 218, 220, in combination with resistors 230 and 210 form a start-up circuitry that is used to place oscillator 200 in the proper operating condition during a start-up mode. Inverter 218 in combination with resistors 230 and 210 and oscillator 200 form a clock circuit selected for optimum start-up performance and oscillator drive level. Inverter 220 is used to buffer the output from the clock circuit into other circuits such as control block 112 and inverter 222.

Output signal TX_Enable, also generated by control block 112, is applied to the base terminal of transistor 230 via resistor 228. The collector terminal of transistor 230 is coupled to the ground terminal and the emitter terminal of transistor 230 is coupled to node N2. Signal TX_enable is used to switch transistor 230 on or off, thereby enabling or disabling signal TX_Trig.

To achieve frequency modulation by changing the temperature of the oscillator 200, periodically a synchronous receiver (not shown) is used to detect for any received signal within the synchronous receivers bandwidth causing interference. During such times, signal TX_enable signal is disabled, i.e., the transmitter is disabled. Next, the receiver continues to look for interference from other RF signal generators. To inhibit such interference, signal OSC_Heat_PWM is varied to change the amount of heat generated by resistors 202, 204, 206, and 208, thereby to change the temperature of oscillator 200. Changing this temperature causes the frequency of signal TX_Trig to change, which provides a changing synchronous receiver clock and provides the same change to the energy spectrum stimulus to transistor 220 causing a RF transmission at a different frequency. The disabling of the transmitter is carried out periodically to detect for interference followed by additional heat applied to the oscillator. The changing application of heat to the oscillator continues until no interference is received by the synchronous receiver.

In one embodiment, control block 112 which may be a commercially available micro-controller detects interference from other RF sources. In some embodiments, oscillator 200 has a temperature sensitivity of 50 ppm/° C. Approximately 3.5 ppm shift in time-base may be sufficient to provide the desired rejection of interfering RF sources by the synchronous receiver. In accordance with the present invention, in some embodiments, 100 ppm total shift in frequency is achieved.

The above embodiments of the present invention are illustrative and not limiting. Various alternatives and equivalents are possible. The invention is not limited by the technique used to dynamically vary the biasing voltage applied to the terminals of the high frequency transistor, which include modulation, e.g., pulse-width, pulse amplitude or otherwise, digital-to-analog conversions, and the like. The invention is not limited by the type of integrated circuit in which the present disclosure may be disposed. Nor is the disclosure limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A circuit operative to modulate oscillation frequency of a transmit signal, the circuit comprising:
   a control block adapted to dynamically modulate a generated signal;
   a filter adapted to modify a biasing voltage applied to a first terminal of a transistor in response to variations in the generated signal to generate a biasing signal; and
   a pulse generator adapted to generate a pulse signal in response to detection of a transition of an oscillating signal, said transistor adapted to generate a radio frequency signal burst at a harmonic of the frequency of the generated pulse in response to receipt of a low-to-high or high-to-low transition of the generated pulse signal wherein voltage of the biasing signal selects the harmonic of the frequency of the pulse signal.

2. The circuit of claim 1 wherein said generated signal is a pulse-width modulated signal.

3. The circuit of claim 1 wherein said generated signal is an pulse-amplitude modulated signal.

4. The circuit of claim 1 wherein said generated signal is a multi-bit signal, the circuit further comprising:
   a digital-to-analog converter configured to convert the multi-bit signal to an analog signal.

5. The circuit of claim 1 further comprising an RC filter adapted to filter out high frequency components of the modulated signal.

6. The circuit of claim 5 further comprising an amplifier adapted to generate the biasing signal in response to receipt of the filtered modulated signal at its positive input terminal, wherein a negative input terminal of the amplifier is coupled to an output terminal of the amplifier.

7. The circuit of claim 6 further comprising an oscillator adapted to generate the oscillating signal.

8. The circuit of claim 7 wherein the generated signal is modulated by varying a value of a register disposed in the control block.

9. The circuit of claim 8 wherein said control block is a commercially available microcontroller.

10. A circuit operative to modulate oscillation frequency of a transmit signal, the circuit comprising:
    a control block adapted to dynamically modulate a generated signal;
    a filter adapted to modify a biasing voltage applied to a first terminal of a transistor in response to variations in the generated signal;
    a pulse generator adapted to generate a pulse signal in response to detection of a transition of an oscillating signal; said transistor adapted to generate a radio frequency signal in response to receipt of a low-to-high or high-to-low transition of the generated pulse;
    an RC filter adapted to filter out high frequency components of the modulated signal;
    an amplifier adapted to generate the biasing signal in response to receipt of the filtered modulated signal at its positive input terminal, wherein a negative input terminal of the amplifier is coupled to an output terminal of the amplifier; and
    an oscillator adapted to generate the oscillating signal,
    wherein the generated signal is modulated by varying a value of a register disposed in the control block,
    wherein said control block is a commercially available microcontroller, and
    wherein a gate terminal of said transmit transistor is coupled to the ground potential.

11. A method of modulating an oscillation frequency of a transmit signal, the method comprising:

modulating a generated signal dynamically;
varying a biasing signal in response to modulation of the generated signal;
applying the biasing signal to a first terminal of a transmit transistor;
generating a pulse in response to detection of a transition of a clock signal;
applying the generated pulse to a second terminal of the transmit transistor to generate a radio frequency burst at a harmonic of the frequency of the generated pulse in response to a low-to-high or high-to-low transition of the generated pulse, wherein voltage of the biasing signal selects the harmonic of the frequency of the generated pulse.

12. The method of claim 11 wherein said generated signal is a pulse-width modulated signal.

13. The method of claim 11 wherein said generated signal is an pulse-amplitude modulated signal.

14. The method of claim 11 wherein said generated signal is a multi-bit signal, the method further comprising:
converting the multi-bit signal to an analog signal.

15. The method of claim 11 further comprising:
filtering out high frequency components of the modulated signal.

16. The method of claim 15 further comprising:
amplifying the filtered out modulated signal to generate the biasing signal.

17. The method of claim 16 wherein the generated signal is modulated by varying a register value.

18. A method of modulating an oscillation frequency of a transmit signal, the method comprising:
modulating a generated signal dynamically;
varying a biasing signal in response to modulation of the generated signal;
applying the biasing signal to a first terminal of a transmit transistor;
generating a pulse in response to detection of a transition of a clock signal; and
applying the generated pulse to a second terminal of the transmit transistor;
filtering out high frequency components of the modulated signal;
amplifying the filtered out modulated signal to generate the biasing signal;
varying a register value for modulate the generated signal: and
coupling a gate terminal of said transmit transistor to the ground potential.

19. The circuit of claim 10 wherein said generated signal is a pulse-width modulated signal.

20. The circuit of claim 10 wherein said generated signal is an pulse-amplitude modulated signal.

21. The circuit of claim 10 wherein said generated signal is a multi-bit signal, the circuit further comprising:
a digital-to-analog converter configured to convert the multi-bit signal to an analog signal.

22. The circuit of claim 10 further comprising an RC filter adapted to filter out high frequency components of the modulated signal.

23. The circuit of claim 22 further comprising an amplifier adapted to generate the biasing signal in response to receipt of the filtered modulated signal at its positive input terminal, wherein a negative input terminal of the amplifier is coupled to an output terminal of the amplifier.

24. The circuit of claim 23 further comprising an oscillator adapted to generate the oscillating signal.

25. The circuit of claim 24 wherein the generated signal is modulated by varying a value of a register disposed in the control block.

26. The circuit of claim 25 wherein said control block is a commercially available microcontroller.

27. The method of claim 18 wherein said generated signal is a pulse-width modulated signal.

28. The method of claim 18 wherein said generated signal is an pulse-amplitude modulated signal.

29. The method of claim 18 wherein said generated signal is a multi-bit signal, the method further comprising:
converting the multi-bit signal to an analog signal.

30. The method of claim 18 further comprising:
filtering out high frequency components of the modulated signal.

31. The method of claim 30 further comprising:
amplifying the filtered out modulated signal to generate the biasing signal.

32. The method of claim 31 wherein the generated signal is modulated by varying a register value.

* * * * *